United States Patent [19]
Hizume et al.

[11] Patent Number: 5,483,481
[45] Date of Patent: Jan. 9, 1996

[54] AUTOMATIC WIRING DEVICE FOR DESIGN OF SEMICONDUCTOR INTEGRATED CIRCUIT

[75] Inventors: Kohji Hizume, Ami; Takao Komatsuszaki, Tsukuba, both of Japan

[73] Assignee: Texas Instruments Incorporated, Dallas, Tex.

[21] Appl. No.: 231,217

[22] Filed: Apr. 22, 1994

[30] Foreign Application Priority Data

Apr. 23, 1993 [JP] Japan .................................... 5-120529

[51] Int. Cl.$^6$ .................................................. G06F 15/60
[52] U.S. Cl. .......................... 365/63; 364/490; 364/491
[58] Field of Search ...................... 365/51, 63; 364/491, 364/490

[56] References Cited

U.S. PATENT DOCUMENTS

| | | |
|---|---|---|
| 4,852,015 | 7/1989 | Doyle, Jr. ............................... 364/491 |
| 5,014,242 | 5/1991 | Akimoto .................................. 365/63 |
| 5,046,017 | 9/1991 | Yuyama .................................. 364/491 |
| 5,117,277 | 5/1992 | Yuyama ................................ 365/63 X |
| 5,355,322 | 10/1994 | Yamashita ............................... 364/490 |
| 5,361,214 | 11/1994 | Aoki ........................................ 364/490 |

*Primary Examiner*—David C. Nelms
*Assistant Examiner*—Son Mai
*Attorney, Agent, or Firm*—David S. Guttman; Richard L. Donaldson

[57] ABSTRACT

An automatic wiring device for deriving the shortest distance wiring route in a short time, in designing a semiconductor integrated circuit. First, based on the coordinate positions of respective signal terminals and the coordinate positions of respective channel wiring areas of respective lines, the X-coordinate positions of all of the partial wiring routes ay1, ay2 ..., by1, by2 ..., ayr2, byr2, ayr3, byr3 extending in the Y-direction are determined. Then, based on the positional relations among respective partial wiring routes extending in the Y-direction in respective interlinear wiring areas, the Y-coordinate positions of all of the partial wiring routes ax1-2-3, bx1-2-3, axr2-4-r3, bxr2-r3, axr3-5-6, bxr3-3-4 extending in the X-direction are determined. By these determinations, the wiring routes WA, WB for connecting the signal terminals of respective groups, in a network form, with the shortest distance, are determined.

5 Claims, 8 Drawing Sheets

AUTOMATIC WIRING DEVICE FOR DESIGN OF SEMICONDUCTOR INTEGRATED CIRCUIT

This invention relates to an automatic wiring device in semiconductor integrated circuit design.

BACKGROUND OF THE INVENTION

For the design of a semiconductor integrated circuit, the CAD (Computer Aided Design) technique is usually used. When the logic specification of the semiconductor integrated circuit to be designed is determined, according to this specification, the device design, electronic circuit design, and logic design are carried out in sequence, then, finally, the layout/wiring design is performed. In the layout/wiring design, in accordance with the electronic circuit diagram or logical circuit diagram, the positions for disposing respective functional blocks, such as CPU, memory, and I/O, which are loaded in the chip, are determined by an automatic layout program, then, the wiring routes between these blocks are determined by the automatic wiring program (Router). When the layout/wiring design is completed, based on it, a plotting processing for preparing the mask pattern is conducted.

Referring to FIGS. 11 and 12, a description of a procedure for automatic wiring processing by a conventional router follows. In a chip area 100, the layout positions of a multiple number of functional blocks P1, P2, P3, . . . , Q1, Q2, Q3, . . . are determined in advance by an automatic layout program. In the respective blocks Pi, Qi, signal terminals Ai, Bi (for the convenience of description, 2 types are used) are provided. In the chip area 100, the area other than the blocks P1, P2, P3, . . . , Q1, Q2, Q3, . . . (space area) is the area where the wiring routes can be set, that is, the wiring area. A conventional router typically determines the wiring routes between signal terminals of respective groups in the following manner.

First, the wiring routes for connecting the signal terminals of the first group A1, A2, A3, . . . are determined. For this purpose, for example, the signal terminal A1 of the block $P_1$ at the left end in the first line is set as the origin. As the positions of the other signal terminals A2, A3, . . . in the first group relative to the said signal terminal A1 can be obtained as vectors, based on those vectors, the partial wiring routes extending along the X-direction or Y-direction are determined in sequence while generating random numbers, by directing those routes towards the other signal terminals A2, A3, . . . , then, by connecting those partial wiring routes, a network-form wiring route WA1 that connects all signal terminals of the first group A1, A2, A3, . . . is obtained (FIG. 11). Next, by executing the foregoing processing again, the other wiring route WA2 is obtained (FIG. 11). Even with the same processing, because the way of appearance of random numbers is different, both wiring routes WA1, WA2 are different at least partially in routes from each other, and they are different also in total distance (total length). In this manner, by repeating the same processing many times, a large number of wiring routes WA1, WA2, WA3, . . . are obtained, then, from these wiring routes, the wiring route that is shortest in total distance WAi is selected (determined) (FIG. 12).

Thereafter, the processing for determining the wiring route for connecting the signal terminals of the second group B1, B2, B3, . . . is executed. Also in this processing, as in the above-mentioned processing, a large number of wiring routes WB1, WB2, WB3, . . . (not shown in the figure) for connecting all connection terminals $B_1$, $B_2$, $B_3$ . . . in the second group are obtained, and, from those wiring routes, the route with shortest distance WBi is selected (FIG. 12).

As mentioned above, in the conventional router, because the method used is that to determine the partial wiring routes in the X-direction or Y-direction in sequence while generating random numbers at places within the wiring area and then to connect them, optional wiring routes which can connect the signal terminals of respective groups A1, A2, A3, . . . , B1, B2, B3, . . . are derived or generated. Among those wiring routes, not only are the simple and clear wiring routes WA1, WA2, WAi, WBi included, as shown in FIGS. 11 and 12, but also many of those which have evidently wasteful or superfluous partial wiring routes, such as that reaching the signal terminal through hunching wa1, that return again after coming out of the channel wiring area once wa2, and that go around the outside of the end block wa3, as shown in FIG. 13. Accordingly, almost infinitely numerous wiring routes WA1, WA2, WA3, . . . , WB1, WB2, WB3, . . . are derived, and the wiring routes WAi, WBi having the shortest total distance are selected from those numerous wiring routes. Consequently, it takes an extremely long time for the processing to be completed. Thus, in actual situations, even in the newest type of workstation, several hours are readily required for processing. Besides, there are many cases in which the wiring routes selected from the large number of derived wiring routes are not the wiring routes shortest in total distance (true shortest distance wiring routes) among all possible wiring routes. As a result, the automatic wiring design has to be done again, or a correction by a manual design has to be carried out.

With such problems in mind, it is an object of the invention to provide an automatic wiring device capable of deriving a shortest distance wiring route efficiently in a short time period in the design of a semiconductor integrated circuit.

SUMMARY OF THE INVENTION

In accordance with this invention, with respect to a single or multiple number of functional blocks arrayed at arbitrary intervals in the X-direction in each of the multiple lines which are set up at arbitrary intervals in the Y-direction within a chip area of a proposed semiconductor integrated circuit, an automatic wiring device for determining the wiring routes to connect the signal terminals of the functional blocks within the wiring area defined by the intervals in the X-direction or Y-direction is provided. Regarding the signal terminals of each group to be connected to each other, the automatic wiring device has a means to determine the X-coordinate position of each partial wiring route extending in the Y-direction, based on the coordinate position of each signal terminal and the coordinate position of each channel wiring area in each line, and a means to determine the Y-coordinate position of each partial wiring route extending in the X-direction, based on the positional relations of respective partial wiring routes extending along the Y-direction within the interlinear wiring area.

In the automatic wiring device of the invention, the wiring routes with the shortest distance are determined unequivocally based on the definitely determined parameters, such as the coordinate position of the signal terminal, the coordinate position of the channel wiring area, and the positional relations of the respective partial wiring routes extending in the Y-direction within each interlinear wiring area. Therefore, it is not necessary to generate random numbers or to have a large number of wiring routes derived. Thus, the true

Figure 1:
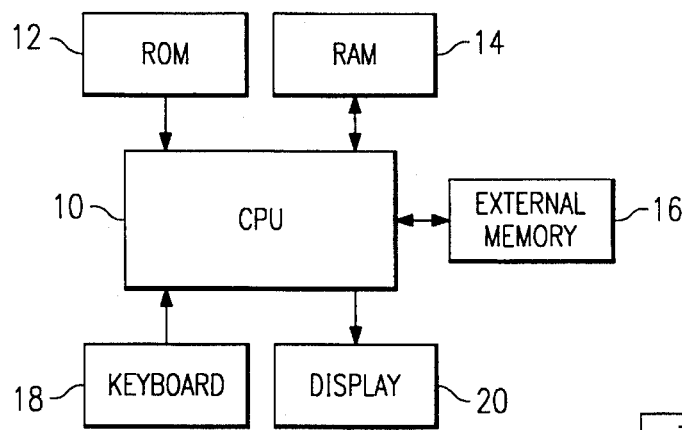
FIG. 1 is a block diagram showing an automatic wiring device according to one embodiment of the invention.

Reference numerals and symbols as shown in drawings:
10 CPU
12 ROM
14 RAM
16 External memory
18 Keyboard
20 Display
100 Chip area
P1 . . . , Q1 . . . Functional block
ROW1 . . . Line (line block)
RS1-2 . . . Interlinear wiring area
C1H1 . . . Channel wiring area
ay1, by1 . . . Partial wiring route extending in the Y-direction
ax1-2-3, by1-2-r3 . . . Partial wiring route extending in the X-direction
WA Wiring route of signal terminals of the first group
WB Wiring route of signal terminals of the second group

DESCRIPTION OF PREFERRED EMBODIMENT

FIG. 1 is a block diagram showing an automatic wiring device according to an embodiment of the invention. The automatic wiring device is a CAD system, and comprises a ROM 12, a RAM 14, an external memory 16, a keyboard 18 and a display 20 interconnected to a CPU 10 through respective interfaces (not shown in the figure). The ROM 12 functions as a program memory for storing primarily various types of programs which define the operations of the CPU 10. The RAM 14 functions as a work memory for storing mainly various types of data used in the operation of the CPU 10. The router according to this embodiment (automatic wiring program) may be stored in the ROM 12 in advance, or may be loaded in the RAM 14 from the external memory 16. The external memory 16 functions also as the data base for providing various types of data necessary for designing the automatic layout/wiring. The keyboard 18 and display 20 function as a man-machine-interface between the CPU or software and the designer.

Figure 2:
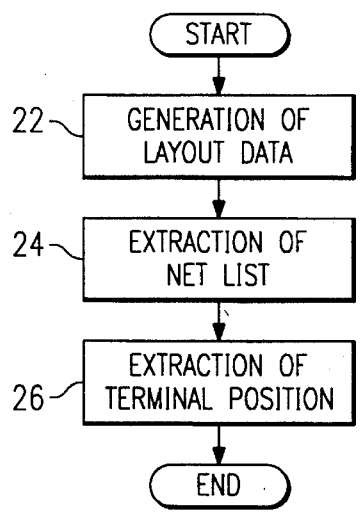
FIG. 2 is a flow chart of preliminary processing by the wiring router in the embodiment of FIG. 1.

FIG. 2 is a flow chart of the preliminary processing of the router according to the embodiment of FIG. 1. First, from the external memory 16 or the keyboard 18, the layout data necessary for the automatic wiring design, such as the data on the logic circuits of each functional block, and the data on the layout positions within the chip, are input, then, these data are fetched into the RAM 14 (step 22). Next, as the net list, for example, various types of signals to be exchanged between respective functional blocks are extracted from the layout data (step 24). Finally, the position of the signal terminal of each functional block, for inputting/outputting the signal thus extracted is extracted from the layout data (step 26). In addition, in the step 26, also the X-coordinate position of the terminal position representing point in each interlinear wiring area, that will be mentioned later, is obtained.

Figure 3:
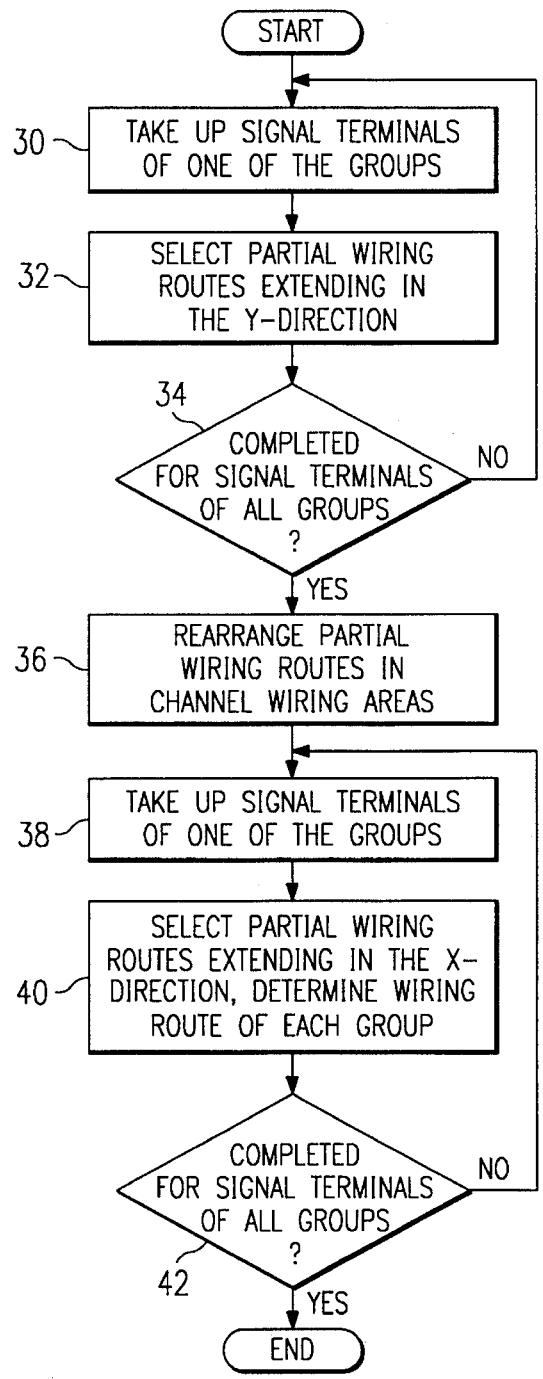
FIG. 3 is a flow chart showing the processing procedure of the wiring router in the embodiment of FIG. 1.
Figure 11:
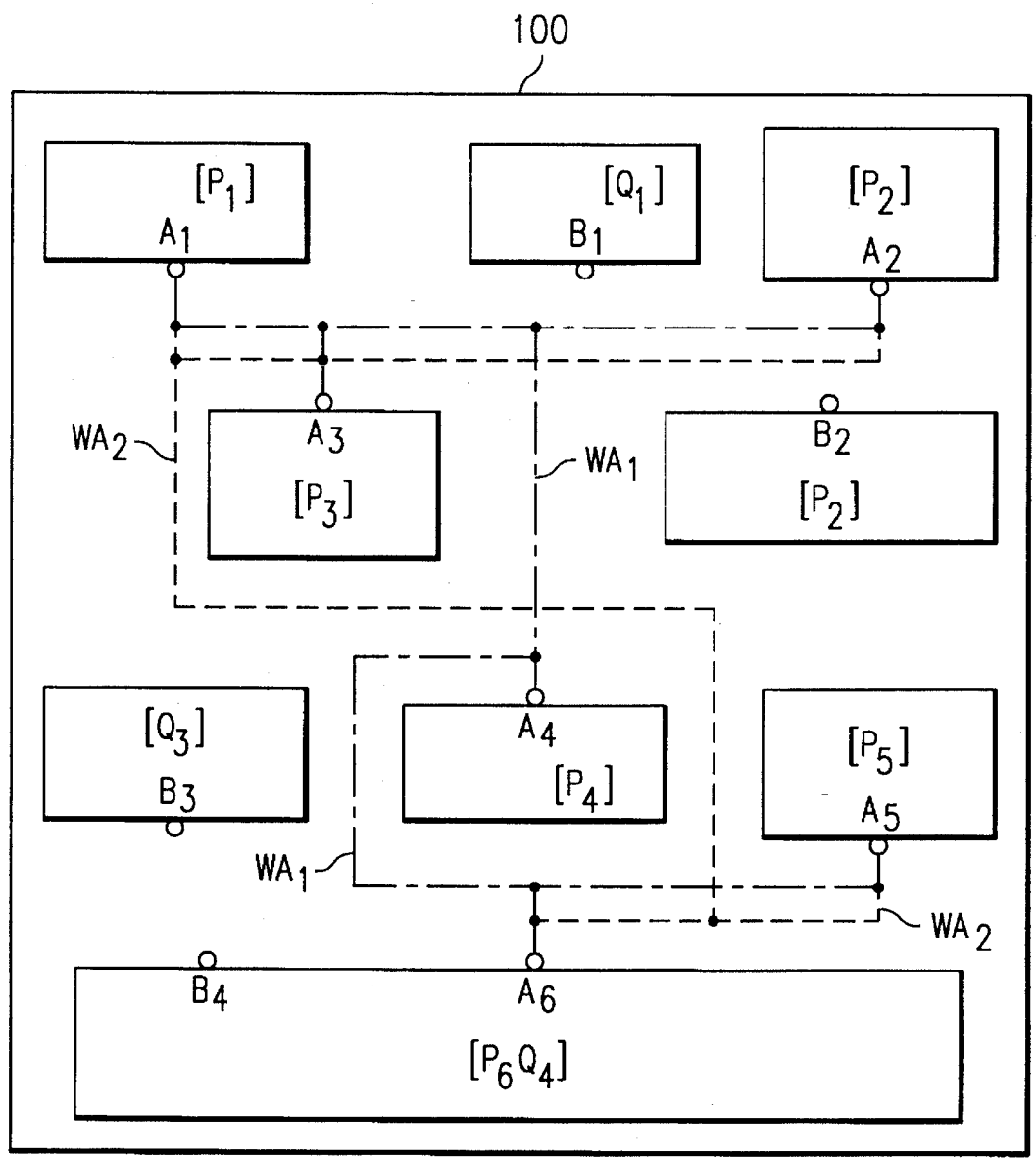
FIG. 11 is a diagram illustrating the method of processing by a conventional wiring router.
Figure 12:
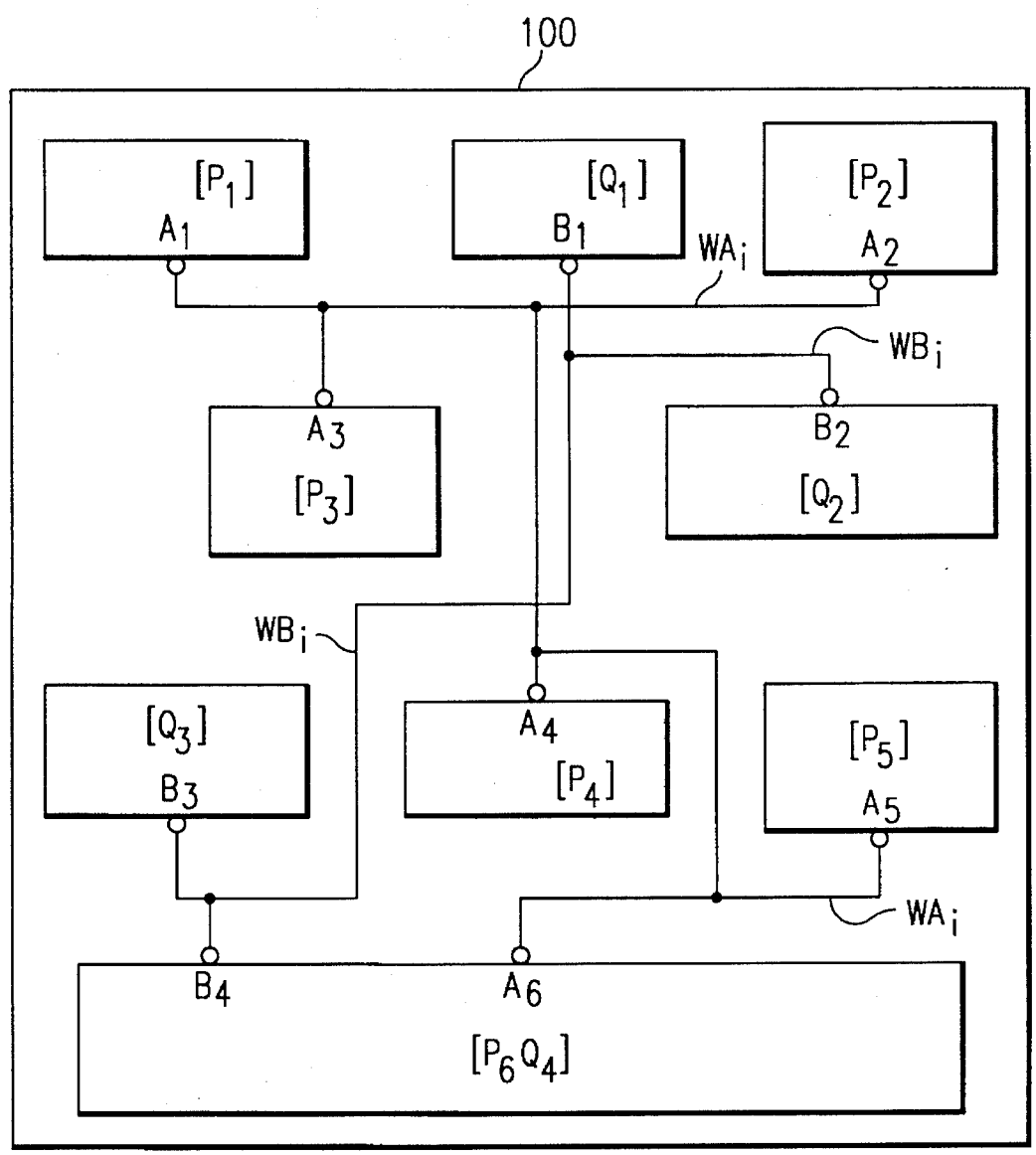
FIG. 12 is a diagram illustrating the method of processing by the conventional wiring router.
Figure 13:
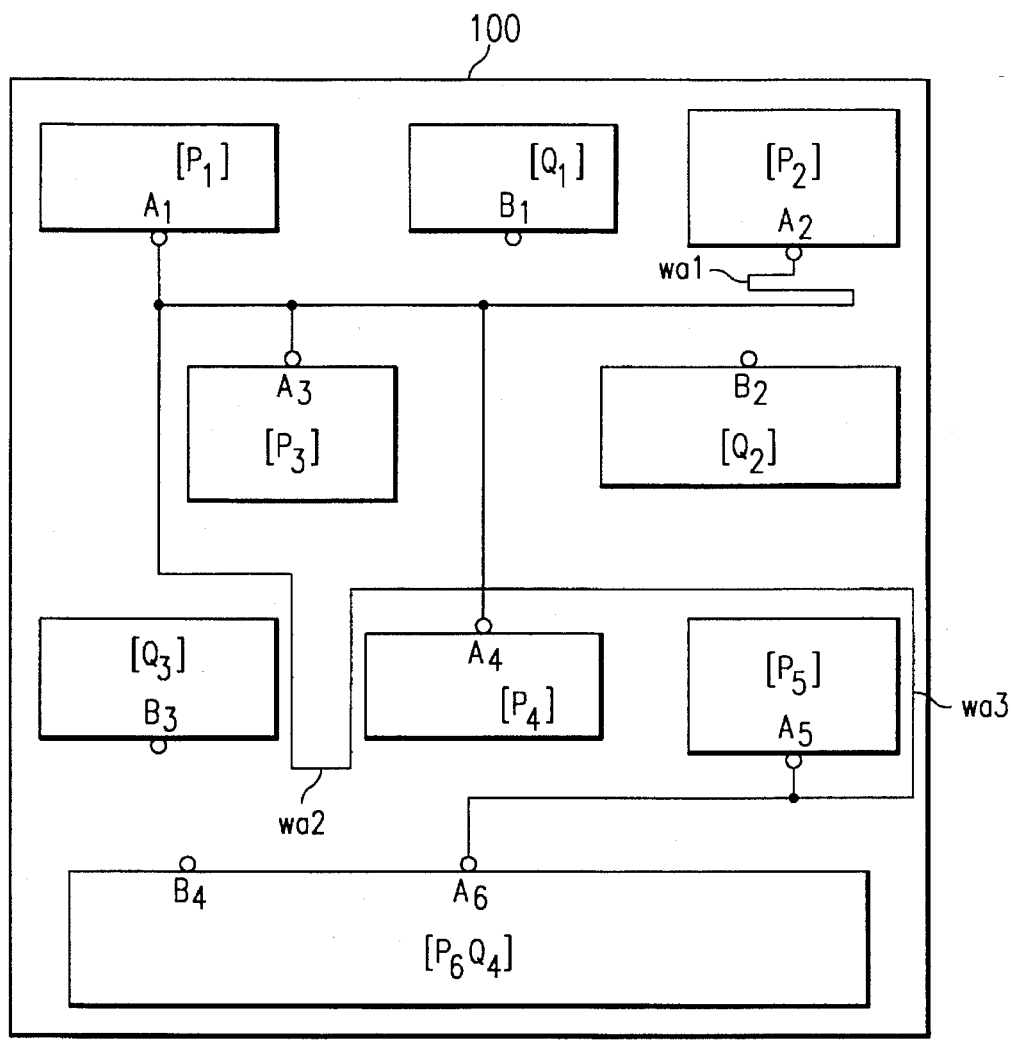
FIG. 13 is a diagram illustrating problems encountered in using the conventional wiring router.

FIG. 3 is a flow chart showing the processing procedure of the router of the embodiment of FIG. 1, that is executed by the CPU 10. FIGS. 4 through 10 are the diagrams for illustrating the method of the processing of the wiring router of the embodiment of FIG. 1. Also in this embodiment, for the convenience of explanation, the case in which a large number of functional blocks P1, P2, P3, . . . , Q1, Q2, Q3, . . . are laid out in the chip area 100, with the pattern being the same as in the case (FIGS. 11–13) referred to in the description of the prior art, is used as an example.

Figure 4:
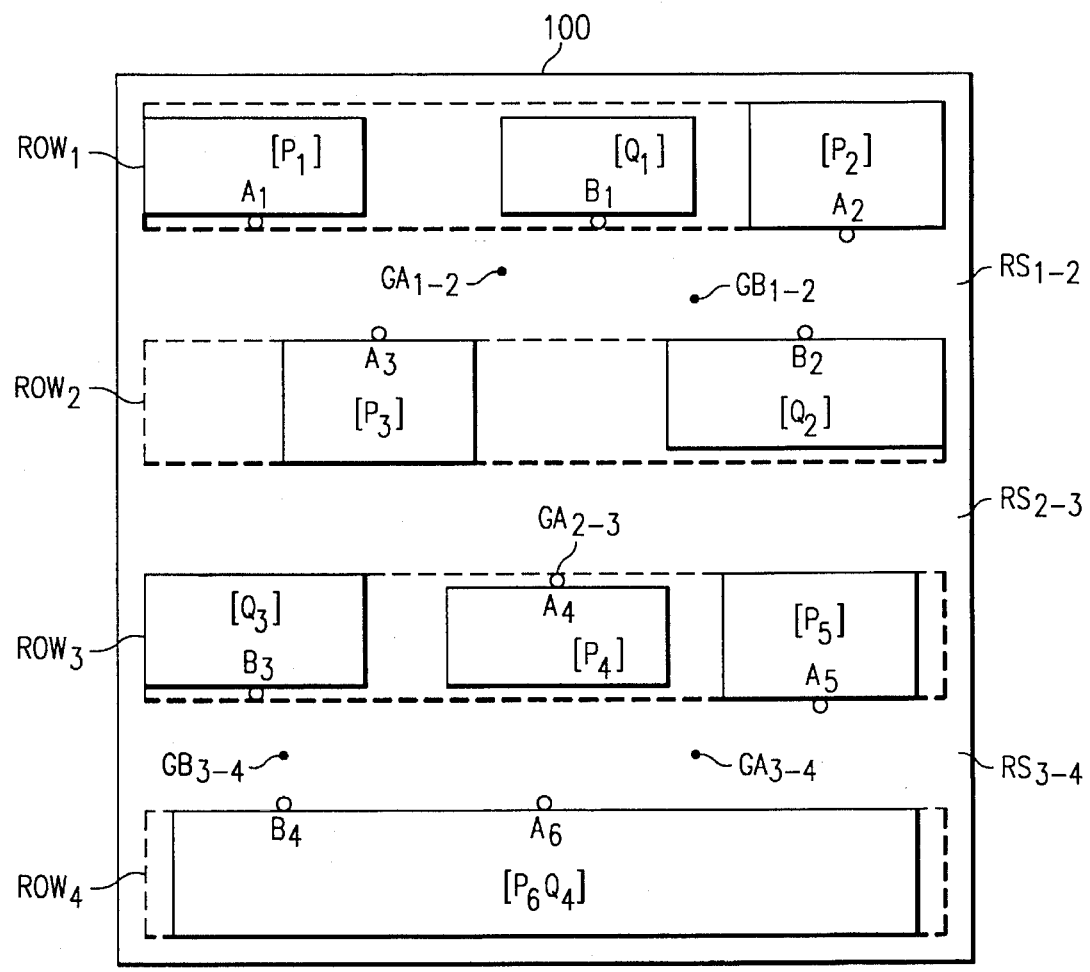
FIG. 4 is a diagram illustrating the processing technique of the wiring router of the embodiment of FIG. 1.

In the router of this embodiment, as shown in FIG. 4, the functional blocks P1, P2, P3, . . . , Q1, Q2, Q3, . . . in the chip area 100 are divided into line blocks ROW1 through ROW4 along the Y-direction. The width of each line block ROWi in the Y-direction may be defined as the distance between the upper end position and lower end position of all functional blocks laid out in the X-direction within that block, and the width of said line block ROWi in the X-direction may be defined as the distance between one end (left edge) to the other end (right edge) of the chip area 100. The reason for making it possible to define the line blocks ROW1 through ROW4 in such a way is that, in the stage of automatic layout design, in each of the four lines ROW1 through ROW4 set up at specified intervals in the Y-direction in the chip area 100, one or a multiple number of functional blocks (for example, in the first line, three functional blocks P1, Q1, P2) are laid out at specified intervals in the X-direction.

Also, in FIG. 4, in each of the respective interlinear wiring areas RS1-2, RS2-3, RS3-4, the terminal position representing points GA1-2, GB1-2, . . . are defined. Each terminal position representing a point is obtained as a mean value of the coordinate positions of one or multiple signal terminals facing to the applicable wiring area between lines. For example, if the coordinate positions of the signal terminals A1, A2, A3 of the first group, which are facing to the interlinear wiring area RS1-2 between the first and second lines are set as (Ax1, Ay1), (Ax2, Ay2), (Ax3, Ay3), respectively, the coordinate position (GA1-2 x, GA1-2 y) of the terminal position representing point GA1-2 of the first group can be obtained by using the following equations.

$$GA1\text{-}2x = (Ax1 + Ax2 + Ax3)/3 \qquad (1)$$

$$GA1\text{-}2y = (Ay1 + Ay2 + Ay3)/3 \qquad (2)$$

Likewise, when the coordinate positions of the signal terminals B1, B2 of the second group, which are facing to the interlinear wiring area RS1-2 between the first and second lines are set as (Bx1, By1), (Bx2, By2), respectively, the coordinate position of the terminal position representing point (GB1-2 x, GB1-2 y) of the second group can be obtained by using the following equations.

$$GB1\text{-}2x = (Bx1 + By2)/2 \qquad (3)$$

$$GB1\text{-}2y = (By1 + By2)/2 \qquad (4)$$

Figure 5:
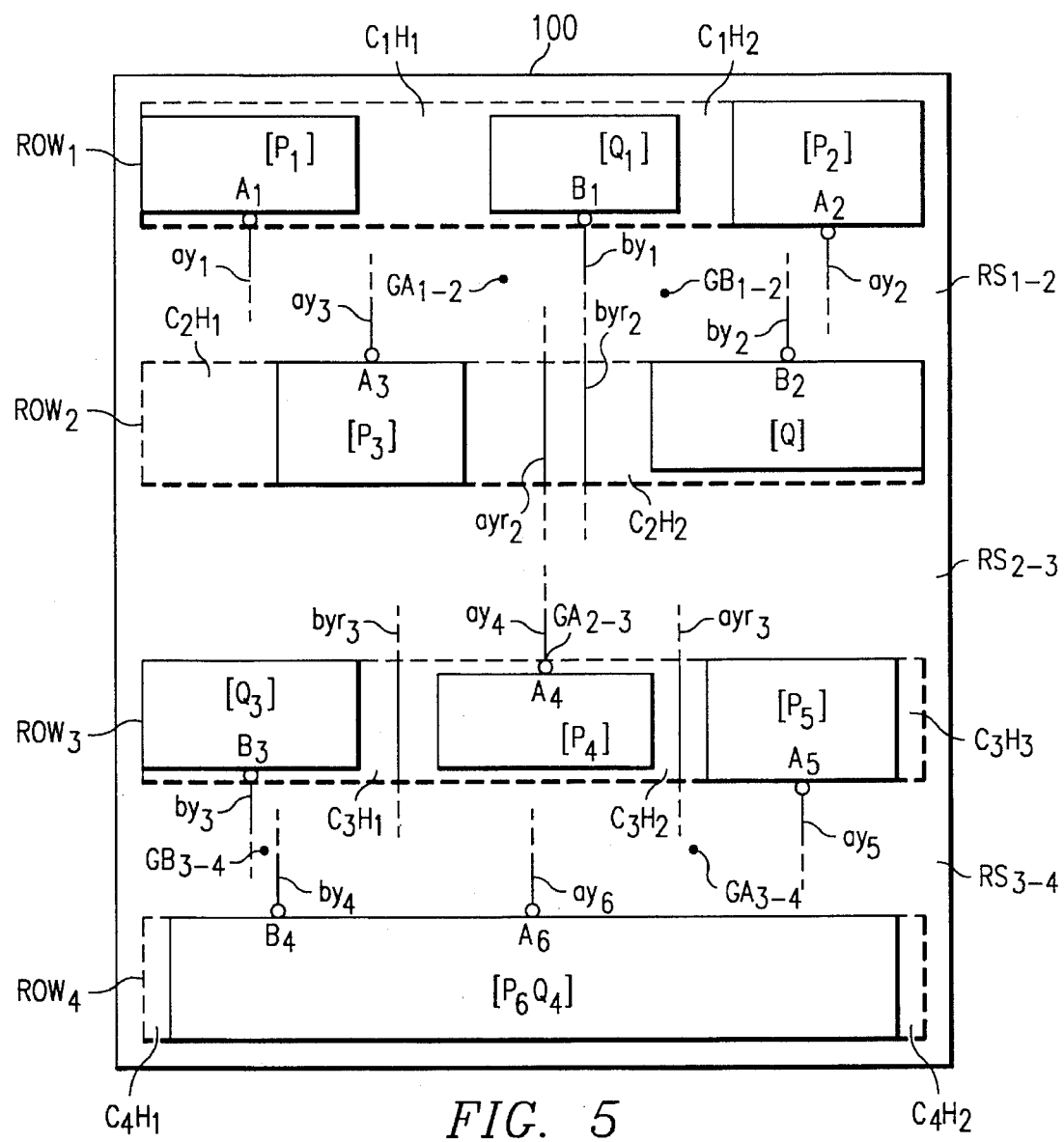
FIG. 5 is a diagram illustrating the processing method of the wiring router of the embodiment of FIG. 1.

According to the router of this embodiment, as shown in FIG. 5, first, the X-coordinate positions of all partial wiring routes ay1, ay2, . . . by1, by2 . . . ayr2, byr2, ayr3, byr3 extending in the Y-direction are determined (steps 30 through 34).

Of these partial wiring routes, ay1, ay2 . . . are the partial wiring routes extending in undefined length in the Y-direction by using respective signal terminals A1, A2, . . . of the first group as the starting points, and they are derived from the XY-coordinate positions of respective signal terminals A1, A2, . . . by1, by2, . . . are the partial wiring routes extending, from respective signal terminals B1, B2, . . . of the second group, in the Y-direction, and they are derived from the XY-coordinate positions of respective signal terminals B1, B2, . . . .

That which is denoted by ayr2 is the partial wiring route for the first group that crosses the second line block ROW2, transversely in the Y-direction, and it is derived from the X-coordinate positions of respective channel wiring areas C2H1, C2H2 in the second line, the X-coordinate position of the terminal position representing point GA1-2 of the first group in the interlinear wiring area RS1-2 between the first and second lines, and the X-coordinate position of the terminal position representing point GA2-3 of the first group in the interlinear wiring area RS2-3 between the second and third lines. It is possible to go through from the interlinear wiring area RS1-2 side between the first and second lines to the interlinear wiring area RS2-3 side between the second and third lines by passing through either one of the two channel wiring areas C2H1, C2H2 in the second line. However, since the wiring route with the shortest distance can be obtained by passing through the channel wiring area C2H2 that is close to the terminal position representing points GA1-2, GA2-3 on both sides, the second channel wiring area C2H2 is selected.

That which is denoted by byr2 is the partial wiring route for the second group that crosses the second line block ROW2 transversely in the Y-direction, and it is derived from the X-coordinate positions of the channel wiring areas C2H1, C2H2 in the second line, the X-coordinate position of the terminal position representing point GB1-2 of the second group in the interlinear wiring area RS1-2 between the first and second lines, and the X-coordinate position of the terminal position representing point GB2-3 of the second group in the interlinear wiring area RS2-3 between the second and third lines. Also in this case, just as in the case of ayr2 mentioned above, the second channel wiring area C2H2 that is close to the terminal position representing points GB1-2, GB2-3 on both sides is selected. However, in the example shown in FIG. 5, the signal terminal Bi of the second group, that is facing the interlinear wiring area RS2-3 between the second and third lines, is not present. In such case, the terminal position representing point GB3-4 of the second group in the interlinear wiring area RS3-4 between the third and fourth lines may be used as a dummy terminal position representing point GB2-3, or, by removing the terminal position representing point GB2-3 from the parameters, the channel wiring area through which the partial wiring route byr2 passes may be determined only from the X-coordinate position of the terminal position representing point GB1-2 of the second group in the interlinear wiring area RS1-2 between the first and second lines.

Furthermore, in the second channel wiring area C2H2 in the second line, the partial wiring route ayr2 of the first group and the partial wiring route byr2 of the second group pass through it together side by side. In this case, the positional relationship between both routes is determined based on the respective points representing the terminal position. In the example in FIG. 3, the channel wiring areas to be passed through (transverse crossing) are determined for the signal terminals of all groups (steps 30 through 34). Thereafter, the rearrangement of respective partial wiring routes in the applicable channel areas is carried out (step 36). Also, even if the same channel wiring area is selected for the multiple groups, for example, 3 groups, when only 2 groups of partial wiring routes can get into that channel wiring area, in step 34 or step 36, the partial wiring route of the last group is determined in a manner that its route goes around to the other channel wiring area by avoiding said former channel wiring area.

That which is denoted by ayr3 is the partial wiring route of the first group, that crosses the third line block ROW3, transversely in the Y-direction, and it is derived from the X-coordinate positions of the channel wiring areas C3H1, C3H2, C3H3 in the third line, the X-coordinate position of the terminal position representing point GA2-3 of the first group in the interlinear wiring area RS2-3 between the second and third lines, and the X-coordinate position of the terminal position representing point GA3-4 of the first group in the interlinear wiring area RS3-4 between the third and fourth lines. For the first group, the second channel wiring area C3H2 that is closest in position to the terminal position representing points GA2-3, GA3-4 on both sides is selected.

That which is denoted by byr3 is the partial wiring route of the second group that crosses the third block ROW3 transversely in the Y-direction, and it is derived from the X-coordinate positions of the channel wiring areas C3H1, C3H2, C3H3 in the third line, the X-coordinate position of the partial wiring route byr2 that passes through the second channel wiring area C2H2 in the second line, and the X-coordinate position of the terminal position representing point GB3-4 of the second group in the interlinear wiring area RS3-4 between the third and fourth lines. For the second group, the first channel wiring area C3H1 that is closest in position to the X-coordinate position of the partial wiring route byr2 and the terminal position representing point GA3-4 is selected.

When the X-coordinate positions of the partial wiring routes ay1, ay2 . . . , by1, by2 . . . , ayr2, byr2, ayr3, byr3 extending in the Y-direction are determined in a manner as mentioned above, next, the Y-coordinate positions of the partial wiring routes ax1-2, bx1-2, . . . extending in X-direction in the interlinear wiring areas RS1-2, RS2-3, RS3-4 are determined (steps 38, 40, 42). At the same time, by these partial wiring routes ax1-2, bx1-2, . . . extending in the X-direction, the lengths (end positions) of the partial wiring routes ay1, ay2 . . . , by1, by2 . . . , ayr2, byr2, ayr3, byr3 are also determined.

In this embodiment, in order to determine the partial wiring routes in the X-direction and the Y-direction, which are shortest in total distance in each of the interlinear wiring areas RS1-2, RS2-3, RS3-4, efficiently in a short time, the following three wiring patterns are defined.

Figure 6:
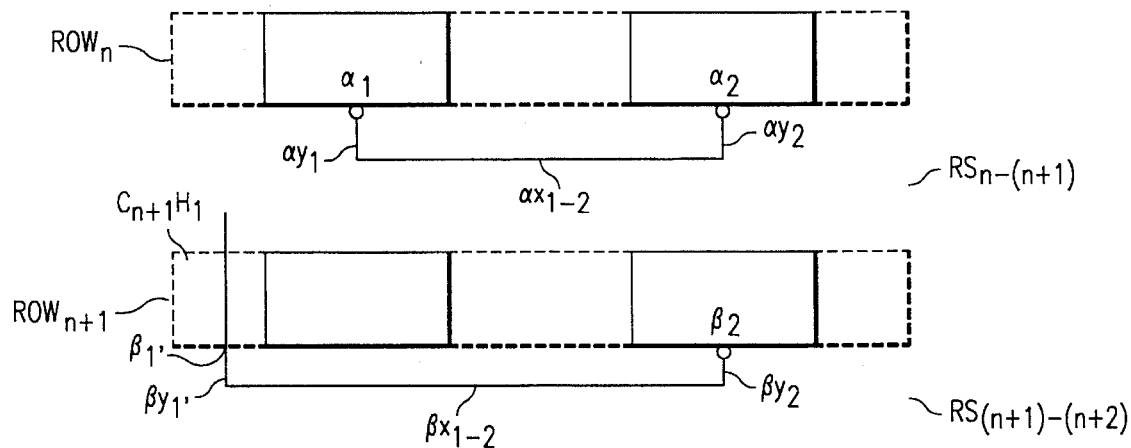
FIG. 6 is a diagram illustrating the processing method of the wiring router in the embodiment of FIG. 1.

The first pattern is that for the case of mutually connecting the multiple wiring routes in the same group, which are extending, from the same line block, in the Y-direction within the same interlinear wiring area, by the partial wiring routes extending in the X-direction. For example, as shown in FIG. 6, two partial wiring routes $\alpha y1$, $\alpha y2$ extending in the Y-direction in the interlinear wiring area RSn-(n+1), from the signal terminals $\alpha 1$, $\alpha 2$ of the Jth group belonging to the nth line block ROWn are connected by a partial wiring route $\alpha x1-2$, and, in this way, the wiring route of the Jth group in the interlinear wiring area RSn-(n+1) is determined. Also, the partial wiring route $\beta y1'$ of the Kth group, that passes through toward the interlinear wiring area RS(n+1)–(n+2) by crossing the channel wiring area Cn+1H1 of the (n+1)th line block transversely in the Y-direction, and the partial wiring route $\beta y2$ that extends in the Y-direction from the signal terminal $\beta 2$ of the Kth group belonging to the (n+1)th line block ROWn+1, are connected by one partial wiring route $\beta x1-2$ extending in the X-direction, and, in this way, the wiring route of the Kth group in the interlinear wiring area RS(n+1)–(n+2) is determined. In the case of this pattern, when the partial wiring routes $\alpha x1-2$, $\beta x1-2$ extending in the X-direction are selected at the Y-coordinate positions which are the closest possible in position to the respective line blocks ROWn, ROWn+1, the total distances ($|\alpha y1|+|\alpha y2|+|\alpha x1-2|$), ($|\beta y1'|+|\beta y2|+|\beta x1-2|$) of the respective groups in the applicable interlinear wiring areas RSn-(n+1), RS(n+1)–(n+2) become shortest.

Figure 7:
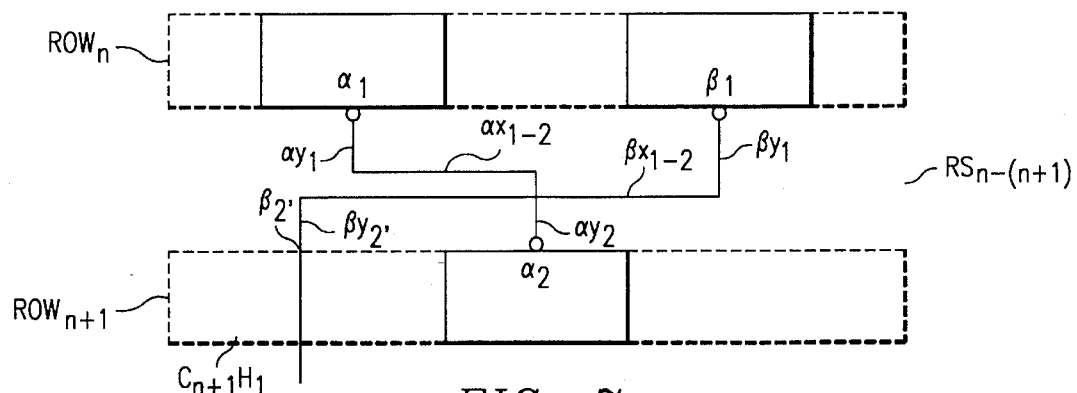
FIG. 7 is a diagram illustrating the method of processing by the wiring router in the embodiment of FIG. 1.

The second pattern is that used for the case of mutually connecting two partial wiring routes in the same group, which extend in the Y-direction in the same interlinear wiring area, from the neighboring blocks, by the partial wiring route extending in the X-direction. For example, as shown in FIG. 7, two partial wiring routes $\alpha y1$, $\alpha y2$ extending in the Y-direction within the interlinear wiring area RSn-(n+1), respectively from the signal terminal $\alpha 1$ of the Jth group belonging to the nth line block ROWn and the signal terminal $\alpha 2$ of the jth group belonging to the (n+1)th line block ROWn+1 are connected by one partial wiring route $\alpha x1-2$ extending in the X-direction, and, in this way, the wiring route of the Jth group in the interlinear wiring area RSn-(n+1) is determined. Also, the partial wiring route $\beta y1$ extending in the Y-direction in the interlinear wiring area RSn-(n+1) from the signal terminal $\beta 1$ of the Kth group belonging to the nth line block ROWn and the partial wiring route $\beta 2'$ extending in the Y-direction in the interlinear wiring area RSn-(n+1) by passing through the channel wiring area Cn+1H1 of the (n+1)th block, are connected by one partial wiring route $\beta x1-2$ extending in the X-direction, and, in this way, the wiring route of the Kth group in the interlinear wiring area RSn-(n+1) is determined. In the case of this pattern, even if the partial wiring routes $\alpha x1-2$, $\beta x1-2$ extending in the X-direction are selected at the optional Y-coordinate positions, the total distance ($|\alpha y1|+|\alpha y2|+|\alpha x1-2|$), ($|\beta y1|+|\beta y2'|+|\beta x1-2|$) of the wiring routes of each group in the applicable interlinear wiring area RSn-(n+1) is constant.

Figure 8:
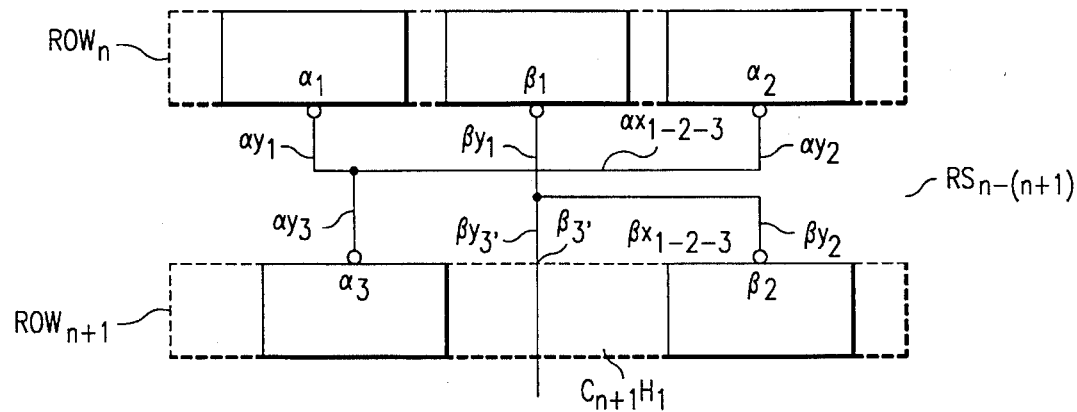
FIG. 8 is a diagram illustrating the method of processing by the wiring router in the embodiment of FIG. 1.

The third pattern is used for the case of mutually connecting not less than three partial wiring routes in the same group, which extend in the Y-direction in the same interlinear wiring area, from the neighboring blocks, by the partial wiring route extending in the X-direction. For example, as shown in FIG. 8, three partial wiring routes $\alpha y1$, $\alpha y2$, $\alpha y3$ which extend in the Y-direction in the interlinear wiring area RSn-(n+1), respectively, from the signal terminals $\alpha 1$ and $\alpha 2$ of the Jth group, which belong to the nth line block ROWn, and signal terminal $\alpha 3$ of the Jth group, that belongs to the (n+1)th line block ROWn+1, are connected by one partial wiring route $\alpha x1-2-3$, and, in this way, the wiring route of the Jth group in the interlinear wiring area RSn-(n+1) is determined. Also, the partial wiring route $\beta y1$ extending in the Y-direction in the interlinear wiring area RSn-(n+1), from the signal terminal $\beta 1$ of the Kth group, that belongs to the nth line block ROWn, the partial wiring route $\beta y2$ extending in the Y-direction in the interlinear wiring area RSn-(n+1), from the signal terminal $\beta 2$ of the Kth group, that belongs to the (n+1)th line block ROWn+1, and the partial wiring route $\beta y3'$ extending in the Y-direction in the interlinear wiring area RSn-(n+1) through passing the channel wiring area Cn+1H2 of the (n+1)th line block, are connected by one partial wiring route $\beta x1-2-3$ extending in the X-direction. In this way, the wiring route of the Kth group in the interlinear wiring area RSn-(n+1) is determined. In the case of this pattern, when the partial wiring routes $\alpha x1-2-3$, $\beta x1-2-3$ extending in the X-direction are selected at the Y-coordinate positions which are the closest possible in position to the block larger in number of signal terminals or of partial wiring routes in the Y-direction (ROWn in the case of $\alpha x1-2-3$, ROWn+1 in the case of $\beta x1-2-3$), the total distance ($|\alpha y1|+|\alpha y2|+|\alpha y3|+|\alpha x1-2-3|$), ($|\beta y1|+|\beta y2|+|\beta y3'|+|\beta x1-2-3|$) of the wiring routes of each group in the applicable interlinear wiring area RSn-(n+1) becomes shortest.

Figure 9:
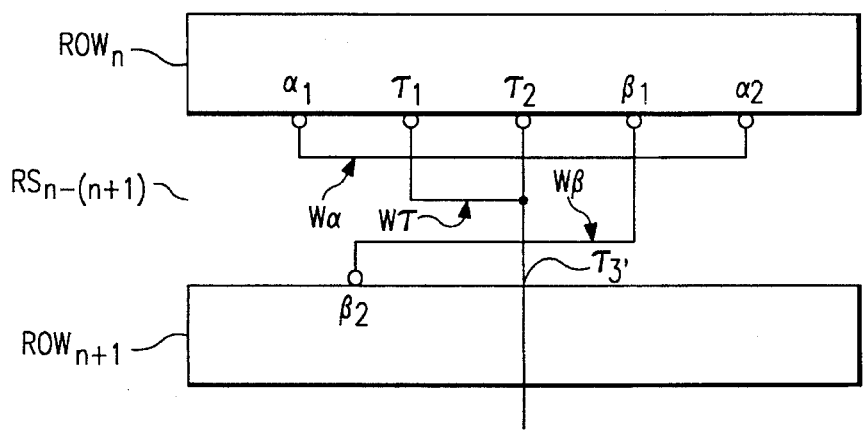
FIG. 9 is a diagram illustrating the method of processing by the wiring router in the embodiment of FIG. 1.

FIG. 9 shows the positional relations for the case when the foregoing three patterns are present in a mixed form in the same interlinear wiring area RSn-(n+1). As shown in FIG. 9, the wiring route w$\alpha$ of the first pattern is selected at the position closest to the line block ROWn, the wiring route w$\gamma$ of the third pattern is selected at the position closest to the line block ROWn with priority next to the wiring route of the first pattern, and the wiring route w$\beta$ of the second pattern is selected at the position farthest from the line block ROWn (the position close to the center portion of the interlinear wiring area RSn-(n+1).

Figure 10:
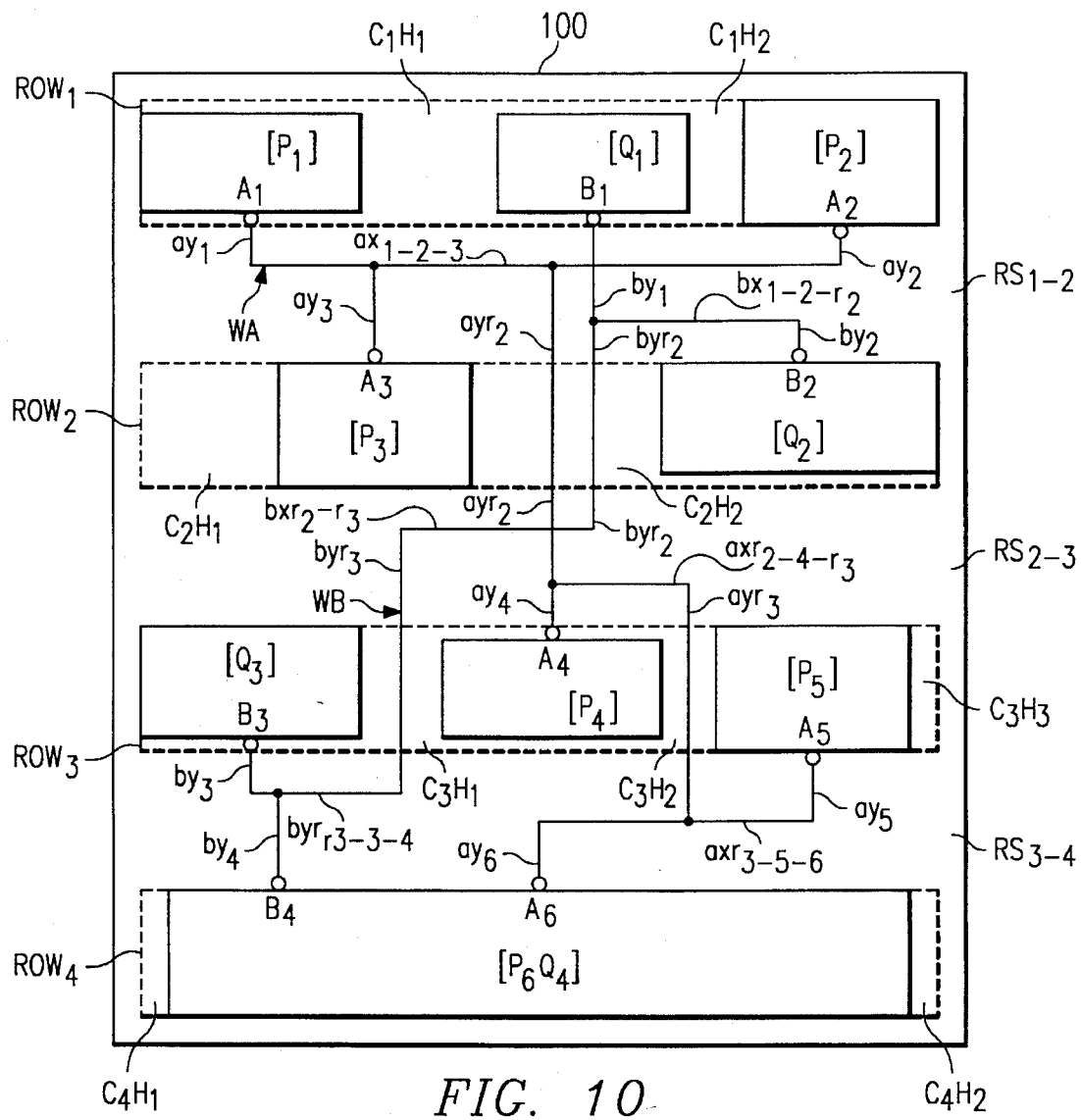
FIG. 10 is a diagram illustrating the method of processing by the wiring router in the embodiment of FIG. 1.

When, by following the rules of the three patterns mentioned above, the steps 38 through 42 are executed for respective partial wiring routes extending in the Y-direction in FIG. 5, as shown in FIG. 10, the partial wiring routes extending in the X-direction in respective interlinear wiring areas RS1-2, RS2-3, RS3-4 are connected for each group. As a result, the network-form wiring routes WA, WB are determined separately for respective groups.

As described above, according to this embodiment, first, based on the coordinate position of each signal terminal, the coordinate position of each channel wiring area of each line, and the coordinate position of the point representing the terminal position in each interlinear wiring area (this coordinate position is obtained from the coordinate position of the signal terminal), the X-coordinate positions of all partial wiring routes ay1, ay2 . . . , by1, by2 . . . , ayr2, byr2, ayr3, byr3 extending in the Y-direction are determined (steps 30 through 36). Then, based on the positional relations among respective partial wiring routes extending in the Y-direction in respective interlinear wiring areas (first, second and third patterns), the Y-coordinate positions of all of the partial wiring routes ax1-2-3, bx1-2-3, axr2-4-r3, bxr2-r3, axr3-5-6, bxr3-3-4 extending in X-direction are determined (steps 38 through 42). As a result, the wiring routes WA, WB which connect the signal terminals of respective groups with the shortest distance in network-like form, respectively, are determined. In other words, this is the method by which the wiring route with the shortest distance is determined unequivocally based on the determined parameters, such as the coordinate position of the signal terminal, the coordinate position of the channel wiring area, and the positional relations among respective partial wiring routes extending in the Y-direction in respective interlinear wiring areas. By using this method, the true shortest distance wiring route is obtained in a short time.

As an example, when the processing time was compared between a conventional wiring router and the wiring router according to this embodiment under the specification conditions of 3000 terminals, 7 lines, and 15 functional blocks, it was confirmed that while it takes 7 to 8 hours by the conventional router, it takes less than 5 minutes by the router of the embodiment of this invention.

In the drawings, each signal terminal is represented by a single point, and each wiring route and each partial wiring route are represented by a single line, respectively. However, it goes without saying that the actual signal terminal, wiring route and partial wiring route have respective widths corresponding to the wiring width.

As has been described, the automatic wiring device for the design of a semiconductor integrated circuit in accordance with this invention, by determining the X-coordinate position of the partial wiring routes extending in the Y-direction, based on the coordinate position of each signal terminal as well as the coordinate position of each channel wiring area of each line, then determining the Y-coordinate position of each partial wiring route extending in the X-direction, based on the positional relations among respective partial wiring routes extending in the Y-direction in each interlinear wiring area, provides the wiring route for connecting respective signal terminals in network form with the shortest distance efficiently in a short time.

We claim:

1. An automatic wiring device for a specified semiconductor integrated circuit having a chip area within which are multiple functional blocks, each having a signal terminal to be wired, comprising:

means for analyzing the circuit into multiple line blocks distributed at specified intervals in the Y-direction within the chip area and a single or multiple number of functional blocks disposed at specified intervals in the X-direction in each of the multiple line blocks, the wiring routes between the signal terminals of the functional block(s) being within a wiring area defined by the specified intervals in said X-direction which form channel wiring areas and intervals in the Y-direction;

means for identifying groups of functional blocks whose terminals are to be mutually connected;

means for determining by group the X-coordinate position of each partial wiring route extending in the Y-direction from a terminal in the group or for a terminal in the group through a wiring channel based on the coordinate position of each signal terminal and each coordinate position of each channel wiring area in each line block; and linking means for determining by group, based on the positional relations of respective wiring routes extending along the Y-direction in respective interlinear wiring areas, a corresponding Y-coordinate position of each partial wiring route extending in the X-direction that links up two or more partial wiring routes of the group in a way that contributes to minimizing that group's total wiring distance.

2. The device of claim 1 wherein the linking means distinguishes by rule between (i) connecting partial wiring routes in the same group extending in the Y-direction from the same line block, (ii) connecting two partial wiring routes in the same group extending in the Y-direction from adjacent line blocks, and (iii) connecting three or more partial wiring routes in the same group extending in the Y-direction in from adjacent line blocks.

3. A wiring router for a specified circuit having a plurality of functional blocks disposed among wiring areas to be wired in a specified way, each functional block providing a terminal, comprising:

(a) analyzing means for analyzing the circuit into (i) a plurality of line blocks parallel to a first axis and distributed along a second axis, (ii) interlinear wiring areas between facing line blocks, and (iii) within each line block, one or more functional blocks parallel to the first axis and wiring channels crossing the line block parallel to the second axis;

(b) data means for (i) grouping functional blocks which must be wired together into groups for processing together and (ii) for specifying the line blocks, interlinear wiring areas, functional blocks, wiring channels, and terminals by first and second coordinates along the first and second axes; and (c) processing means for specifying for each group, from the coordinates of terminals and available wiring channels in the group,
      (i) a projecting wire of indefinite length from each terminal parallel to the second axis and sufficient traversing wires of indefinite length parallel to the second axis to traverse any intervening line block via a wiring channel that minimizes that group's total wiring distance, and
      (ii) sufficient linking wires parallel to the first axis to join up the projecting and traversing wires so as to make them of definite length and to minimize that group's total wiring distance.

4. The wiring router of claim 3 wherein the processing means distinguishes by rule between (i) connecting projecting and/or traversing wises in the same group extending in the Y-direction from the same line block, (ii) connecting two projecting and/or traversing wires in the same group extending in the Y-direction from adjacent line blocks, and (iii) connecting three or more projecting and/or traversing wires in the same group extending in the Y-direction from adjacent line blocks.

5. A method of wiring a specified circuit having a plurality of functional blocks disposed among wiring areas to be wired in a specified way, each functional block providing a terminal, comprising the steps of:

(a) analyzing the circuit into (i) a plurality of line blocks parallel to a first axis and distributed along a second axis, (ii) interlinear wiring areas between facing line blocks, and (iii) within each line block, one or more functional blocks parallel to the first axis and wiring channels crossing the line block parallel to the second axis;

(b) grouping functional blocks which must be wired together into groups for processing together;

(c) specifying the line blocks, interlinear wiring areas, functional blocks, wiring channels, and terminals by first and second coordinates along the first and second axes; and (d) specifying for each group, from the coordinates of terminals and available wiring channels in the group,
      (i) a projecting wire of indefinite length from each terminal parallel to the second axis and sufficient traversing wires of indefinite length parallel to the second axis to traverse any intervening line block via a wiring channel that minimizes that group's total wiring distance, and (ii) sufficient linking wires parallel to the first axis to join up the projecting and traversing wires so as to make them of definite length and to minimize that group's total wiring distance.

* * * * *